United States Patent
Seegerer et al.

(10) Patent No.: US 12,105,172 B2
(45) Date of Patent: Oct. 1, 2024

(54) MAGNETIC RESONANCE TOMOGRAPHY UNIT AND METHOD FOR OPERATING A MAGNETIC RESONANCE TOMOGRAPHY UNIT WITH LIMITED BANDWIDTH

(71) Applicant: Siemens Healthcare GmbH, Erlangen (DE)

(72) Inventors: Georg Seegerer, Erlangen (DE); Stephan Kannengießer, Wuppertal (DE); Rainer Schneider, Erlangen (DE); Jürgen Nistler, Erlangen (DE); Markus Vester, Nuremberg (DE)

(73) Assignee: Siemens Healthineers AG, Forchheim (DE)

( * ) Notice: Subject to any disclaimer, the term of this patent is extended or adjusted under 35 U.S.C. 154(b) by 107 days.

(21) Appl. No.: 17/709,346

(22) Filed: Mar. 30, 2022

(65) Prior Publication Data
US 2022/0317213 A1 Oct. 6, 2022

(30) Foreign Application Priority Data
Mar. 31, 2021 (DE) .................. 10 2021 203 257.5

(51) Int. Cl.
*G01R 33/483* (2006.01)
*G01R 33/36* (2006.01)
*G01R 33/54* (2006.01)
(52) U.S. Cl.
CPC .......... *G01R 33/483* (2013.01); *G01R 33/36* (2013.01); *G01R 33/543* (2013.01)

(58) Field of Classification Search
CPC ..... G01R 33/483; G01R 33/36; G01R 33/543
See application file for complete search history.

(56) References Cited

U.S. PATENT DOCUMENTS

| 4,766,381 | A | * | 8/1988 | Conturo | ............... | G01R 33/482 |
|---|---|---|---|---|---|---|
| | | | | | | 324/309 |
| 4,899,110 | A | * | 2/1990 | Furukawa | .......... | G01R 33/3815 |
| | | | | | | 324/320 |

(Continued)

FOREIGN PATENT DOCUMENTS

DE     112012005359 T5    10/2014

*Primary Examiner* — Dixomara Vargas
(74) *Attorney, Agent, or Firm* — Lempia Summerfield Katz LLC

(57) ABSTRACT

A magnetic resonance tomography unit includes a magnet unit having a magnetic controller for generating a homogenous magnetic field. The magnetic controller is configured to change the homogenous magnetic field in a short, predetermined time within image acquisition of an object under examination, such that a Larmor frequency for a predetermined layer of the object under examination remains in a predetermined frequency range. A layer in the object under examination is selected and a value for the homogenous magnetic field, in which the Larmor frequencies of the nuclear spins of the layer lie in a predetermined frequency band, is determined by a control unit taking into account a predetermined magnetic field gradient. The established value for the homogenous magnetic field and the predetermined magnetic field gradient is set by the magnetic controller, and an excitation pulse, frequencies of which only lie in the predetermined frequency band, is emitted.

11 Claims, 2 Drawing Sheets

(56) References Cited

U.S. PATENT DOCUMENTS

| | | | | |
|---|---|---|---|---|
| 5,942,897 | A * | 8/1999 | Kanazawa | G01R 33/56518 324/309 |
| 6,472,872 | B1 * | 10/2002 | Jack, Jr. | G01R 33/3875 324/309 |
| 6,700,374 | B1 * | 3/2004 | Wu | G01R 33/56554 324/309 |
| 7,741,847 | B2 * | 6/2010 | Nakabayashi | G01R 33/3873 324/318 |
| 2004/0113620 | A1 * | 6/2004 | Tsuda | G01R 33/389 324/320 |
| 2013/0102879 | A1 * | 4/2013 | Maclaren | A61B 5/0035 600/410 |
| 2013/0113483 | A1 | 5/2013 | Park | |
| 2014/0125341 | A1 * | 5/2014 | Kwak | G01R 33/3854 29/745 |
| 2014/0333306 | A1 | 11/2014 | Ham | |
| 2016/0061921 | A1 * | 3/2016 | Katscher | G01R 33/5605 324/309 |
| 2016/0131732 | A1 * | 5/2016 | Pfeffer | G01R 33/56536 324/322 |
| 2017/0168128 | A1 * | 6/2017 | Feiweier | G01R 33/443 |
| 2018/0031651 | A1 * | 2/2018 | Iaia | G01R 33/56563 |
| 2018/0113181 | A1 * | 4/2018 | Popescu | H04R 1/10 |
| 2019/0170838 | A1 * | 6/2019 | George | G01R 33/3678 |
| 2019/0293740 | A1 * | 9/2019 | Gebhardt | G01R 33/56563 |
| 2020/0033429 | A1 * | 1/2020 | Darnell | G01R 33/3692 |
| 2020/0359898 | A1 * | 11/2020 | Gleich | A61B 5/0035 |
| 2021/0255267 | A1 * | 8/2021 | Biber | G01R 33/543 |

\* cited by examiner

| | Legend |
|---|---|
| 21 | Gradient Controller |
| 22 | Radio-Frequency Unit |
| 23 | Controller |
| 60 | Magnetic Controller |

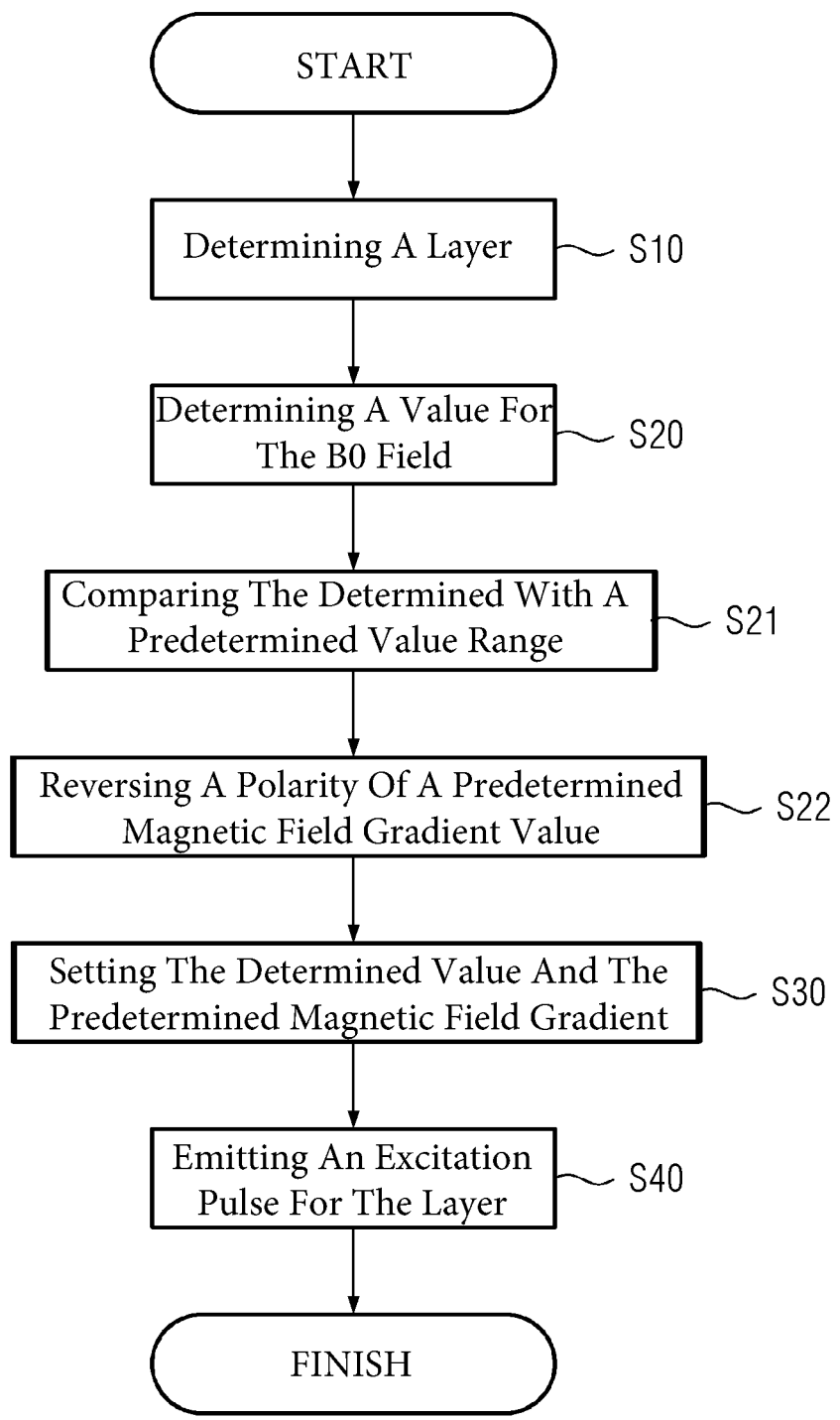

MAGNETIC RESONANCE TOMOGRAPHY UNIT AND METHOD FOR OPERATING A MAGNETIC RESONANCE TOMOGRAPHY UNIT WITH LIMITED BANDWIDTH

This application claims the benefit of German Patent Application No. DE 10 2021 203 257.5, filed on Mar. 31, 2021, which is hereby incorporated by reference in its entirety.

BACKGROUND

The present embodiments relate to a magnetic resonance tomography unit and a method for operating the magnetic resonance tomography unit.

Magnetic resonance tomography units are imaging apparatuses that, for imaging an object under examination, align nuclear spins of the object under examination with a strong external magnetic field and, using an alternating magnetic field, excite these nuclear spins for precession around this alignment. The precession or return of the spins from this excited state into a state with lower energy in turn generates a magnetic alternating field in response, which is received via antennae.

With the aid of magnetic gradient fields, a spatial encoding is impressed on the signals, which subsequently enables an assignment of the received signal to a volume element. The received signal is then evaluated, and a three-dimensional imaging representation of the object under examination is provided. For receiving the signal, local receiving antennae (e.g., local coils) that are arranged directly on the object under examination to achieve a better signal-to-noise ratio may be used. The receiving antennae may also be installed in a patient couch.

Magnetic resonance tomography units use radio-frequency shielding in two respects. Radio-frequency pulses with power output in the kilowatt range, which are only partially absorbed in the patient, are generated for exciting the nuclear spins. Radio waves that leave the patient feedthrough are radiated into the room and are therefore to be screened for compliance with emission limit values.

Conversely, the magnetic resonance signals to be received for imaging are extremely weak. In order to achieve a sufficient signal-to-noise ratio (SNR) here, screening of external interference signals is to be provided.

Therefore, in the prior art, complex shielding cabins are installed around a magnetic resonance tomography unit in order to reduce both emissions and immissions.

SUMMARY AND DESCRIPTION

The scope of the present invention is defined solely by the appended claims and is not affected to any degree by the statements within this summary.

The present embodiments may obviate one or more of the drawbacks or limitations in the related art. For example, outlay for shielding is reduced.

A magnetic resonance tomography unit according to the present embodiments includes a magnet unit with a magnetic controller for generating a homogenous magnetic field B0. The homogenous magnetic field B0 provides alignment of the nuclear spins and specifies a Larmor frequency for nuclear spins. In one embodiment, the B0 field is mainly generated by a superconducting magnet, at low field strengths (e.g., less than 0.5 T), but the field may also be generated by a resistive electromagnet or a permanent magnet.

The magnetic controller is configured to change the B0 magnetic field in a short, predetermined time within image acquisition of an object under examination. For example, the magnetic controller may change a current through the resistive electromagnet. The magnet unit may also include an additional resistive coil with which the magnetic controller modifies the homogenous magnetic field of the superconducting magnet or the permanent magnet to a homogenous magnetic field B0 that varies in field strength to a certain extent. The magnetic field may be changed, for example, by more than 1 mT, 10 mT, 50 mT, or 100 mT. A time span within a sequence is considered to be a short, predetermined time (e.g., between an excitation pulse and a readout process or reception period, such as shorter than 0.5 s, 0.1 s, 50 ms, 10 ms, 1 ms, 0.5 ms, or 100 microseconds). The homogenous magnetic field B0 differs, for example, from inhomogeneous gradient fields and has a negligible spatial gradient in the field of view (e.g., less than 10 mT/m, 2 mT/m, 0.5 mT/m, 0.1 mT/m). The homogenous magnetic field B0 may also be characterized by the homogeneity over the field of view, which is distinguished by a value of less than 100 ppm deviation.

A control unit of the magnetic resonance tomography unit is configured to determine the change in the homogenous magnetic field B0 such that a Larmor frequency for a predetermined layer of the object under examination remains in a predetermined frequency range.

The method according to the present embodiments for operating a magnetic resonance tomography unit is carried out on a magnetic resonance tomography unit according to the present embodiments with a magnet unit and magnetic controller for generating a homogenous magnetic field B0 and a control unit.

In one act of the method, a layer is determined in the object under examination, the nuclear spins of which are to be excited for image acquisition. This may take place, for example, in the context of a sequence and an already established region to be imaged by the control unit. In this case, a plurality of layers may follow one another along a scan axis and may be excited successively in a repetition of the method according to the present embodiments in order to detect a predetermined volume of the object under examination.

In a further act, the control unit determines a value for the B0 field, in which the Larmor frequencies of the nuclear spins of the layer to be detected lie in a predetermined frequency band, taking into account a magnetic field gradient predetermined for image acquisition. For example, the effective magnetic field in the layer may be calculated by adding the B0 field and the product of magnetic field gradients and the location along the axis of the magnetic field gradient. The thickness of the layer along the magnetic field gradient results in a value range for the magnetic field in the layer with a minimum and a maximum. If the Larmor frequencies of the nuclear spins to be detected corresponding to this magnetic field-value range lie outside the predetermined range, the control unit establishes the difference between maximum (e.g., if the frequency is above) or minimum (e.g., if the frequency is below) and the closest limit of the predetermined range from the control unit and determines a corresponding differential value of the frequencies and thus of a corresponding magnetic field for the nuclear spins to be detected. In one embodiment, the magnetic field value range is determined with a safety distance in order, for example, to take into account that an excitation pulse of finite duration cannot have any sharply falling edges in the frequency domain.

In another act, the control unit adjusts the determined value for the B0 field and the predetermined magnetic field gradient using the magnetic controller and the magnet unit. For example, in the case of a superconducting field magnet or permanent magnet for generating the homogenous magnetic field B0, a homogenous correction field with a field strength corresponding to the differential value may be generated by a resistive modulation coil of the magnet unit.

In a further act of the method according to the present embodiments, an excitation pulse for exciting the nuclear spins in the predetermined layer is established and emitted. Due to the homogenous magnetic field determined in the previously described act, the frequencies thereof are only in the predetermined frequency band. For example, the excitation pulse may be calculated in the frequency domain by an FFT from the rectangular function or a rectangular function folded with a window function.

In one embodiment, using the magnetic resonance apparatus according to the present embodiments and the method according to the present embodiments, the emission may also be kept in a limited frequency range in the case of high gradient fields, permitting, for example, higher emissions and thus allowing reduced shielding measures.

In a possible embodiment of the method, the predetermined frequency range lies in an Industry, Science and Medical (ISM) band. ISM bands are regulatory frequency bands for which higher emission values are permissible. ISM bands of interest for magnetic resonance systems lie, for example, between 26.957 MHz and 27.283 MHz or 40.66 MHz and 40.70 MHz.

In one embodiment, higher emission values are permitted in ISM bands, allowing less complex shielding or elimination thereof.

In one embodiment, remaining emissions are reduced by active interference suppression by destructive interference without a shielding cabin below legal limit values.

In one possible embodiment of the magnetic resonance tomography unit, the magnetic controller is configured to reverse a polarity of a magnetic field gradient, for example, in that the current direction is reversed by the gradient coils, whether, for example, by a driver circuit that may reverse the flow direction or a switching apparatus with which the magnetic controller may exchange the connections of the gradient coils on the driver.

In one embodiment of the method, the method according to the present embodiments also includes the act of comparing the determined value of the B0 field with a predetermined value range.

The predetermined value range may correspond via the nuclear spins to be excited in the B0 field and magnetic field gradients in the particular layer and their Larmor frequency to a frequency range and thus to the predetermined frequency band.

In one embodiment, the established (e.g., determined) value for the B0 field exceeds values that may be executed by the magnetic resonance tomography unit. For example, in the case of a permanent magnet or a superconducting field magnet, the homogenous magnetic field cannot be changed for a short time, so that a variation of the homogenous B0 field is to be achieved by a resistive magnetic coil. However, this variation is limited by the current intensity to a maximum Delta B0.

If the established value for the B0 field lies outside the predetermined value range for the B0 field, for example, because the corresponding frequencies of the excitation pulse lie outside the predetermined frequency band, and/or the value of the B0 field cannot be generated by the magnetic controller with the magnet unit, the control unit reverses the polarity of the predetermined magnetic field gradient and repeats the step of establishing a value for the B0 field with the magnetic field gradient of reversed polarity.

In most sequences, layer selection is dependent on the magnetic field strength at the location of the layer, but not on the sign of the gradient. In one embodiment, it may enable the reversal of the magnetic field gradient to excite all the layers of the examination region without leaving the frequency band. For example, there may be a drift of the static magnetic field of the superconducting field magnet, in which the Larmor frequency of the nuclear spins no longer lies in the center of the predetermined frequency band.

In one embodiment of the magnetic resonance tomography unit, the field strength of the field magnet may be adjusted such that the Larmor frequency of the nuclear spins lies at the edge of the predetermined frequency band. In this manner, with a predetermined amount of the gradient field strength and of the magnetic field achievable by the resistive coil, as large a volume as possible may be excited along the gradient axis while maintaining the frequency band and detecting it in the imaging.

In an embodiment of the method, the predetermined frequency band is an industrial, science, medical (ISM) band.

In one embodiment, higher emission values are permissible in an ISM band, and these may be maintained with or without reduced shielding and/or active interference suppression.

A system including two magnetic resonance tomography units according to the present embodiments may also be provided. The two magnetic resonance systems have two different disjoint frequency ranges in which each of the two magnetic resonance systems emits the excitation pulses according to the method according to the present embodiments. For example, the polarity change of the magnetic field gradient may be achieved in that the frequency requirement per system is halved.

BRIEF DESCRIPTION OF THE DRAWINGS

The properties, features and advantages of this invention described above and the manner in which these are achieved will become clearer and more comprehensible in connection with the following description of the exemplary embodiments, which are explained in more detail with reference to the drawings.

FIG. 3 shows a diagrammatic flowchart for an exemplary method.

DETAILED DESCRIPTION

Figure 1:
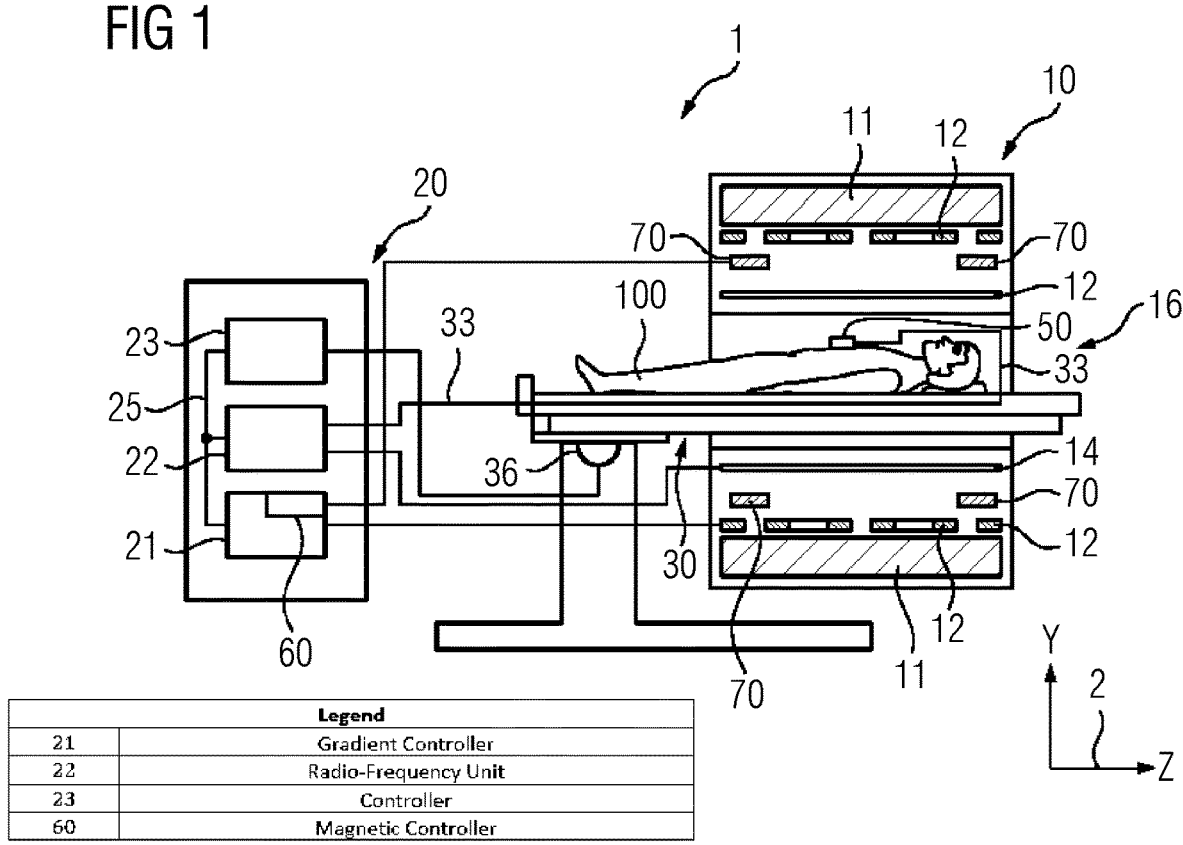
FIG. 1 shows a diagrammatic illustration of one embodiment of a magnetic resonance tomography unit.

FIG. 1 shows a diagrammatic illustration of an embodiment of a magnetic resonance tomography unit 1.

The magnet unit 10 has a field magnet 11 that generates a static magnetic field B0 for aligning nuclear spins of samples or of the patient 100 in a recording region. The recording region is characterized by an extremely homogenous static magnetic field B0. The homogeneity relates, for example, to the magnetic field strength or the amount. The recording region is almost spherical and arranged in a patient tunnel 16 that extends in a longitudinal direction 2 through the magnet unit 10. A patient couch 30 is movable in the patient tunnel 16 by the movement unit 36. The field magnet 11 is usually a superconducting magnet that may provide magnetic fields with a magnetic flux density of up to 3 T or in the most recent devices, even above. However, permanent magnets or electromagnets with normally conducting coils may also be used for lower magnetic field strengths.

Further, the magnet unit 10 has gradient coils 12 that are configured to superimpose temporally and spatially variable magnetic fields in three spatial directions for the spatial differentiation of the acquired imaging regions in the examination volume on the magnetic field B0. The gradient coils 12 are usually coils of normally conducting wires that may generate mutually orthogonal fields in the examination volume.

The magnet unit 10 also has a body coil 14 that is configured to emit a radio-frequency signal supplied via a signal line into the examination volume and to receive resonance signals emitted by the patient 100 and emit the resonance signals via a signal line.

A control unit 20 supplies the magnet unit 10 with the various signals for the gradient coils 12 and the body coil 14 and evaluates the received signals.

Thus, the control unit 20 has a gradient controller 21 that is configured to supply the gradient coils 12 via supply lines with variable currents that, coordinated chronologically, provide the desired gradient fields in the examination volume.

Further, the control unit 20 has a radio-frequency unit 22 that is configured to generate a radio-frequency pulse with a predetermined time profile, amplitude, and spectral power distribution for exciting a magnetic resonance of the nuclear spins in the patient 100. Pulse powers in the range of kilowatts may be achieved. The excitation pulses may be radiated into the patient 100 via the body coil 14 as well as via a local transmission antenna.

A controller 23 communicates with the gradient controller 21 and the radio-frequency unit 22 via a signal bus 25.

A local coil 50 that is connected to the radio-frequency unit 22 and the receiver thereof via a connection line 33 is arranged on the patient 100.

FIG. 1 also shows the magnetic controller 60 (e.g., magnet controller) for changing the homogenous magnetic field B0 as part of the gradient controller 21, but the magnetic controller 60 may also be embodied completely separately from the gradient controller 21. Two modulation coils 70 that are arranged axially in the manner of a Helmholtz coil pair around the z-axis through the center of the patient tunnel 16 are supplied by the magnetic controller 60. If both modulation coils 70 are driven by the magnetic controller 70 with a current in the same flow direction with regard to the winding or direction of rotation around the z-axis, the modulation coils 70 generate a homogenous magnetic field in the recording region or at least a part thereof, which is to be detected in a measurement, and hereinafter also referred to as a measurement volume. The generated homogenous magnetic field of the modulation coils 70 is superimposed on the magnetic field of the superconducting field magnet 11 and, together with the magnetic field of the superconducting field magnet 11, generates a variable homogenous B0 field.

In principle, within the scope of the present embodiments, the gradient coils 12 may also be used in pairs (e.g., the opposite Gx coil pair, Gy coil pair, or Gz coil pair) for a homogenous change in the magnetic field strength of the homogenous magnetic field B0. The gradient controller 21 is, however, to be equipped as a magnetic controller 60 with independent drivers for both magnetic coils of a pair in order to generate a direct current component in the same direction in both coils of the pair. In other words, if the current through the coils is considered to be a vector, where the coils of a pair generate magnetic fields with opposite directions in a measurement volume for the same current direction, then the coils of a pair are interconnected when used as a gradient coil such that the current through the first coil flows in the opposite direction to the current direction of the second coil of the pair. In the case of an addition of the currents with signs, both have opposite signs when used as gradient coils and cancel each other out, so that the generated magnetic fields likewise cancel each other out correspondingly in the plane of symmetry between the coils of the pair. When used according to the present embodiments, the magnetic fields of the two coils add up to a proportion different from zero, which constantly changes the magnetic field strength of the homogenous magnetic field across the measurement volume or the entire recording region. This may be achieved, for example, by separate power stages for generating the currents for each individual coil of a pair. The magnetic controller 60 is configured to feed the separate power stages with a direct current component in the same direction for generating the homogenous magnetic field.

Depending on the sequence, the gradient fields are superimposed at times, as is also customary in the prior art for the different sequences.

Figure 2:
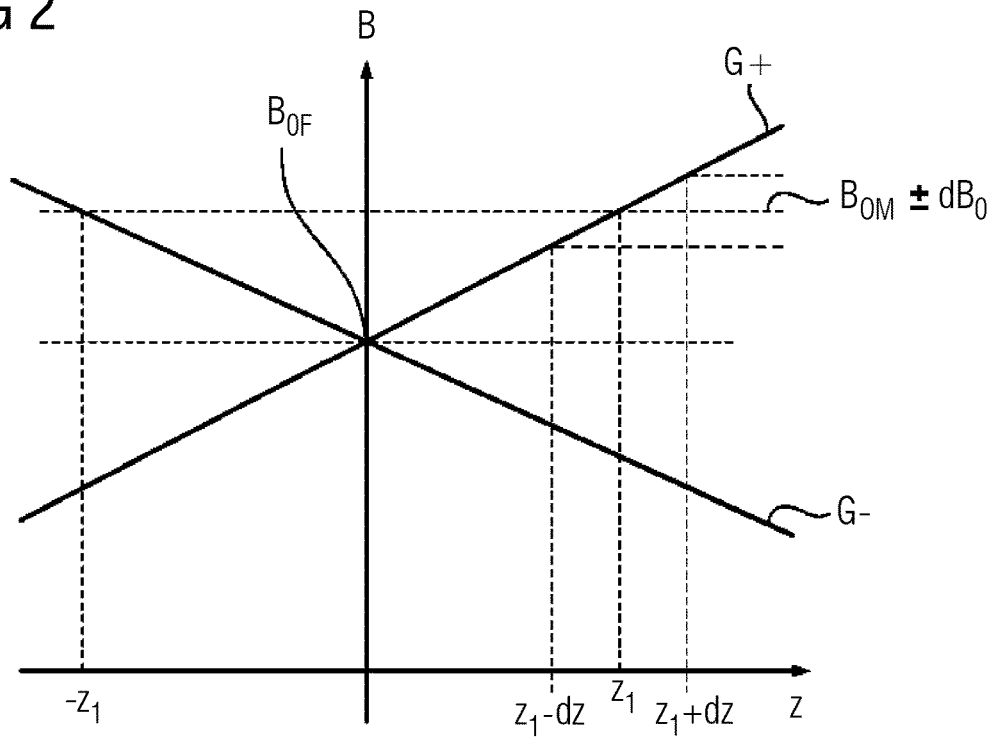
FIG. 2 shows a diagrammatic illustration of a layer to be excited and exemplary magnetic fields involved.

FIG. 2 shows a diagrammatic view of the dependencies of the layer to be excited and the applied magnetic fields. The ordinate indicates a location along the z-axis of the magnetic resonance tomography unit. The abscissa indicates the magnetic field as a function of the location along the z-axis. The value $B_{OF}$ indicates the value of the homogenous static magnetic field generated by the field magnet 11, for example, by a superconducting field magnet 11 or a permanent magnet. The diagonal lines denoted by G+ and G− indicate the value of the superimposed gradient magnetic field and the homogenous magnetic field B0 as a function of the location along the z-axis.

A value $B_{OM}$ is thus obtained at a location z1 that corresponds to the Larmor frequency of the nuclear spins for this magnetic field via the magnetic moment of the nuclear spins to be excited. For the hydrogen atom or proton, the Larmor frequency at B0=1 T is approximately 42.6 MHz.

To excite a layer z1+/−dz, the excitation signal is to include a frequency range that corresponds to the magnetic field strength $B_{OM}$+/−dB via the nuclear magnetic moment.

In order to excite a layer at the location −z1 with an equally strong magnetic field gradient G+, a center frequency corresponding to $2*B_{OF}-B_{OM}$ would be required (e.g., differing by twice the difference $B_{OM}-B_{OF}$). However, if the gradient for G− is inverted, this layer may be excited at the location −z1 at the same magnetic field strength BOM. Overall, the frequency range required for mapping between −z1 and +z1 may be halved. The frequency range may be further reduced by a superimposed homogenous magnetic field of the modulation coils 70.

Although the frequency range may also be achieved without a gradient field reversal by a stronger modulation field of the modulation coils 70, a stronger current with correspondingly higher energy consumption and heat development is connected in the case of resistive modulation coils.

With suitable selection of the static magnetic field B0 of the superconducting field magnet 11, the energy consumption of the modulation coils 70 may also be minimized for a given gradient field strength.

In one embodiment, the required frequency range may thus be halved at a predetermined maximum gradient and a predetermined detection range+/−z1. In one embodiment, a system of two magnetic resonance tomography units may share a predetermined frequency range that would otherwise be occupied solely by a magnetic resonance tomography unit 1 without gradient reversal.

This is particularly relevant if ISM bands are used because of the legal emission restrictions in order to be able to dispense with complete shielding. ISM bands of interest for magnetic resonance systems are, for example, between 26.957 MHz and 27.283 MHz or 40.66 MHz and 40.70 MHz, the bandwidth of which is less than the normally required frequency range of a magnetic resonance tomography unit. The magnetic resonance tomography unit according to the present embodiments is therefore particularly relevant for small magnetic fields of less than 1 T.

FIG. 3 shows a diagrammatic flowchart for the method according to the present embodiments.

In act S10, a layer having nuclear spins that are to be excited for image acquisition is determined in the object under examination. This may be effected by the control unit 20, which, in the context of image acquisition of a volume, divides this into layers and then excites the layers one after another for the subsequent detection of the magnetic resonance signals. In one embodiment, however, this is determined directly by an operator for the detection of a single layer.

In a further act S20, the control unit 20 establishes a value for the B0 field, in which the Larmor frequencies of the nuclear spins of the layer to be detected lie in a predetermined frequency band, taking into account a magnetic field gradient predetermined for image acquisition. In FIG. 2, this corresponds to a shifting of the gradient G+ or G− along the abscissa, until the point of intersection of gradients and the straight line parallel to the abscissa through the ordinates z1+dz or z1−dz, which border the layer to be excited, lie in a magnetic field range of the Larmor frequencies in the predetermined frequency band. If the corresponding frequency range of an excitation pulse should be greater than the predetermined frequency band, the control unit may divide the layer into thinner partial layers and detects these in succession. If it allows the sequence used, a reduction in the magnetic field gradient would also be possible. Act S20 establishing a value for the B0 field may then be repeated with the changed input parameters.

In a further act S30, the magnetic controller 60 sets the determined values for the homogenous B0 field and the predetermined magnetic field gradient by the magnet unit 10. In the case of a permanent magnet or superconducting field magnet, for example, a corresponding direct current is set by the modulation coils 70, which provides a magnetic field with the differential value between the magnetic field strength of the field magnet and the determined value for the homogenous B0 field. In one embodiment, instead of the modulation coils 70, gradient coils 12 with a direct current are applied, generating a uniform homogenous magnetic field of the differential intensity.

In act S40, an excitation pulse is emitted for exciting the specific layer. Due to the previously determined magnetic field strength for the homogenous magnetic field, the frequencies of the excitation pulse are now only in the predetermined frequency band. The signal is generated by an oscillator of the radio-frequency unit 22, amplified by a radio-frequency power amplifier, and emitted via a transmitting antenna (e.g., the body coil 14 or a local coil 50 with a transmission function).

In one possible embodiment of the method, the magnetic controller 60 is configured to reverse a polarity of the predetermined magnetic field gradient. For example, the control of the gradient coil 12 may be configured as an H-circuit that allows a current flow through the gradient coils 12 in two directions. In this case, the value determined in act S20 is compared with a predetermined value range in act S21. Via the magnetic moment of the nuclear spins, the comparison of the value of the magnetic field is equivalent to a comparison of the corresponding frequency value with a predetermined frequency range.

In act S22, the control unit 20 reverses the polarity of the predetermined magnetic field gradient value and repeats the act S20 of determining a value for the homogenous magnetic field B0, but with the magnetic field gradient reversed in the sign.

Although the invention was illustrated and described in more detail by the exemplary embodiments, the invention is not limited by the disclosed examples, and other variations may be derived therefrom by a person skilled in the art without departing from the scope of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance tomography unit, wherein the magnetic resonance tomography unit includes a magnet unit for generating a homogenous B0 magnetic field, the magnet unit comprising a magnet controller, and a control unit, wherein the magnet controller is configured to change the homogenous B0 magnetic field in a predetermined time within image acquisition of an object under examination, the method comprising:

determining a layer to be detected in the object under examination having nuclear spins that are to be excited for image acquisition;

determining, by the control unit, a value for the homogenous B0 magnetic field, in which Larmor frequencies of the nuclear spins of the layer to be detected lie in a predetermined frequency band, taking into account a magnetic field gradient predetermined for image acquisition;

setting, by the magnet controller and the magnet unit, the determined value for the homogenous B0 magnetic field and the predetermined magnetic field gradient, wherein the determined value for the homogenous B0 magnetic field is based on the Larmor frequencies of the nuclear spins of the layer to be detected lying in the predetermined frequency band; and emitting an excitation pulse for the layer having frequencies that only lie in the predetermined frequency band, for exciting the nuclear spins in the determined layer.

2. The method of claim 1, wherein the magnet controller is further configured to reverse a polarity of the predetermined magnetic field gradient, and
wherein the method further comprises:
comparing the determined value for the homogenous B0 magnetic field with a predetermined value range; and
reversing the polarity of the predetermined magnetic field gradient and repeating the determining of the value for the homogenous B0 magnetic field.

3. The method of claim 1, wherein the predetermined frequency band is an ISM band.

4. The method of claim 2, wherein the predetermined frequency band is an ISM band.

5. A magnetic resonance tomography unit comprising:
a magnet unit configured to generate a homogenous B0 magnetic field, the magnet unit having a magnet controller; and
a control unit,
wherein the magnet controller is configured to change the homogenous B0 magnetic field in a predetermined time within image acquisition of an object under examination, such that a Larmor frequency for a predetermined layer of the object under examination remains in a predetermined frequency range.

6. The magnetic resonance tomography unit of claim 5, wherein the magnet unit further comprises a superconducting field magnet configured to generate a static magnetic field component B0 and a resistive coil winding for generating a magnetic field component for changing the B0 magnetic field.

7. The magnetic resonance tomography unit of claim 5, wherein the predetermined frequency range is in an ISM band.

8. The magnetic resonance tomography unit of claim 6, wherein the predetermined frequency range is in an ISM band.

9. The magnetic resonance tomography unit of claim 5, wherein the magnet controller is configured to reverse a polarity of a magnetic field gradient.

10. The magnetic resonance tomography unit of claim 6, wherein the magnet controller is configured to reverse a polarity of a magnetic field gradient.

11. The magnetic resonance tomography unit of claim 7, wherein the magnet controller is configured to reverse a polarity of a magnetic field gradient.

\* \* \* \* \*